United States Patent
Watanabe et al.

(10) Patent No.: US 8,197,606 B2
(45) Date of Patent: Jun. 12, 2012

(54) SUBSTRATE CLEANING METHOD, SUBSTRATE CLEANING APPARATUS, CONTROL PROGRAM, AND COMPUTER-READABLE STORAGE MEDIUM

(75) Inventors: Tsukasa Watanabe, Nirasaki (JP); Naoki Shindo, Nirasaki (JP); Hiroki Ohno, Nirasaki (JP); Kenji Sekiguchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 25 days.

(21) Appl. No.: 12/707,098

(22) Filed: Feb. 17, 2010

(65) Prior Publication Data

US 2010/0206329 A1 Aug. 19, 2010

(30) Foreign Application Priority Data

Feb. 18, 2009 (JP) ................................. 2009-035462

(51) Int. Cl.
*B08B 7/02* (2006.01)
(52) U.S. Cl. .................. 134/6; 451/38; 451/39; 451/40; 451/53; 451/78; 134/7; 134/10; 134/18; 134/21; 134/25.4; 134/26; 134/30; 134/32; 134/33; 134/34; 134/36; 134/38; 134/39; 134/40; 134/42; 134/902

(58) Field of Classification Search ............... 451/38, 451/39, 40, 53, 78; 134/6, 7, 10, 18, 21, 134/25.4, 26, 30, 32, 33, 34, 36, 38, 39, 40, 134/42, 902
See application file for complete search history.

(56) References Cited

U.S. PATENT DOCUMENTS

| | | | | |
|---|---|---|---|---|
| 5,239,788 A * | 8/1993 | Woodson | ......................... | 451/39 |
| 5,294,261 A * | 3/1994 | McDermott et al. | ............. | 134/7 |
| 5,372,652 A * | 12/1994 | Srikrishnan et al. | ............... | 134/7 |
| 5,407,378 A * | 4/1995 | Shank, Jr. | ......................... | 451/38 |
| 5,509,849 A * | 4/1996 | Spears, Jr. | ....................... | 451/40 |
| 5,616,067 A * | 4/1997 | Goenka | ............................ | 451/39 |
| 5,827,114 A * | 10/1998 | Yam et al. | ........................ | 451/75 |
| 5,931,721 A * | 8/1999 | Rose et al. | ....................... | 451/89 |
| 5,934,566 A * | 8/1999 | Kanno et al. | .................. | 239/398 |
| 5,961,732 A * | 10/1999 | Patrin et al. | ....................... | 134/7 |
| 6,004,400 A * | 12/1999 | Bishop et al. | ...................... | 134/2 |
| 6,609,955 B1 * | 8/2003 | Farrow | ............................ | 451/38 |
| 6,905,396 B1 * | 6/2005 | Miller et al. | ..................... | 451/38 |
| 2004/0011378 A1 * | 1/2004 | Jackson | ............................ | 134/1 |
| 2006/0128590 A1 * | 6/2006 | Freer et al. | ..................... | 510/417 |
| 2006/0130886 A1 * | 6/2006 | Tada et al. | ..................... | 134/198 |

FOREIGN PATENT DOCUMENTS

| | | |
|---|---|---|
| JP | 2005-64375 A | 3/2005 |
| JP | 2008-108830 A | 5/2008 |
| WO | WO00/51787 * | 9/2000 |

* cited by examiner

*Primary Examiner* — Bibi Carrillo
(74) *Attorney, Agent, or Firm* — Abelman, Frayne & Schwab (57) ABSTRACT

Disclosed is a substrate cleaning method for prevent damage to a pattern formed on a substrate. The substrate cleaning method includes cleaning the substrate by striking cleaning particulates carried in a flow of dry air or inert gas against a surface of the substrate, and removing the cleaning particulates.

14 Claims, 11 Drawing Sheets

INHALE PARTICULATES
DISSOLVED IN WATER

DRY BY HEATING TO
EVAPORATE WATER $N_2$

SUBSTRATE CLEANING METHOD, SUBSTRATE CLEANING APPARATUS, CONTROL PROGRAM, AND COMPUTER-READABLE STORAGE MEDIUM

This application is based on and claims priority from Japanese Patent Application No. 2009-035462, filed on Feb. 18, 2009, with the Japanese Patent Office, the disclosure of which is incorporated herein in its entirety by reference.

TECHNICAL FIELD

The present disclosure relates to a substrate cleaning method, a substrate cleaning apparatus, a control program, and a computer-readable storage medium.

BACKGROUND

A process for manufacturing a semiconductor device includes a cleaning process in which a semiconductor wafer is cleaned with a chemical liquid (cleaning liquid) and contaminant including particles, organic pollutants, and metal impurities attached to the semiconductor wafer and polymer after the etching process are removed.

A substrate cleaning apparatus performing such a cleaning process includes a single wafer cleaning apparatus which provides a processing liquid to a front surface and a back surface of the semiconductor wafer to perform the cleaning process, then performs a rinsing process according to the necessity, and rotates the semiconductor wafer at a high speed to perform a drying process.

As a method for efficiently removing the particles attached to the semiconductor wafer in such a single substrate cleaning apparatus, there is disclosed technology using two-fluid spray consisting of a chemical liquid and $N_2$ gas (for example, see Japanese Laid-Open Patent Publication No. 2008-108830).

Further, in addition to the above-described method, there is disclosed a cleaning method using ultrasonic waves (for example, see Japanese Laid-Open Patent Publication No. 2005-64375).

Then, the pattern formed on the semiconductor wafer has recently become minute, and when cleaning the semiconductor wafer with the pattern, the damage, such as pattern collapse, may be easily incurred. That is, the damage, such as pattern collapse, may be incurred when trying to sufficiently remove the particles attached to the semiconductor wafer with the two-fluid spray. On the other hand, if the semiconductor wafer is cleaned within a power range generating no damage, such as the pattern collapse, the particles may be not sufficiently removed.

SUMMARY

According to one embodiment, there is provided a substrate cleaning method. The substrate cleaning method includes cleaning a substrate by striking cleaning particulates carried in a flow of dry air or inert gas against a surface of the substrate, and removing the cleaning particulates.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

According to one embodiment, there is provided a substrate cleaning method. The substrate cleaning method includes cleaning a substrate by striking cleaning particulates carried in a flow of dry air or inert gas against a surface of the substrate, and removing the cleaning particulates.

The cleaning particulate may have a particle diameter ranging from 100 nm to 100 μm.

Cleaning the substrate may include mixing and supplying a liquid and cleaning particulates carried in the flow of dry air or inert gas to the surface of the substrate.

The liquid may have a pH between 7 and 11.

The substrate may be rotated during cleaning the substrate.

Removing the cleaning particulates may include supplying a rinsing liquid to the substrate.

The rinsing liquid may have a pH between 7 and 11.

Removing the cleaning particulates may include supplying inert gas to the substrate.

The method may further include drying the substrate by rotating the substrate to remove the rinsing liquid from the surface of the substrate after the supply of the rinsing liquid.

The cleaning particulate may be made of a water-soluble oxide.

The oxide may include CaO or $Y_2O_3$.

The cleaning particulate may be made of a material having a negative zeta potential in the rinsing liquid.

The cleaning particulate may be made of latex.

A pattern may be formed on the substrate.

According to another embodiment, a substrate cleaning apparatus is provided. The substrate cleaning apparatus includes a substrate hold part to horizontally hold a substrate, a particulate mixing part to mix dry air or inert gas with cleaning particulates, and a nozzle to supply a mixture mixed in the particulate mixing part to a surface of the substrate.

The cleaning particulate may have a particle diameter ranging from 100 nm to 100 μm.

The nozzle may be a two-fluid spray nozzle to mix the mixture mixed in the particulate mixing part with a liquid and supply the mixture in a two-fluid spray to the surface of the substrate.

The apparatus may further include a rinsing-liquid supply nozzle to supply a rinsing liquid for removing the cleaning particulates.

The apparatus may further include an inert-gas supply nozzle to supply the inert gas for removing the cleaning particulates.

According to still another embodiment, there is provided a control program executed on a computer for allowing the computer to control a substrate cleaning apparatus to perform the substrate cleaning method.

According to further another embodiment, there is provided a computer-readable storage medium storing a control program executed on a computer. The control program allows the computer to control a substrate cleaning apparatus to perform the substrate cleaning method According to one embodiment, it is possible to provide the substrate cleaning method, the substrate cleaning apparatus, the control program, and the computer-readable storage medium, which can sufficiently remove the particles without incurring the damage, such as the pattern collapse, in the pattern-formed semiconductor wafer.

Hereinafter, embodiments of the present disclosure will be described.

Figure 1A:
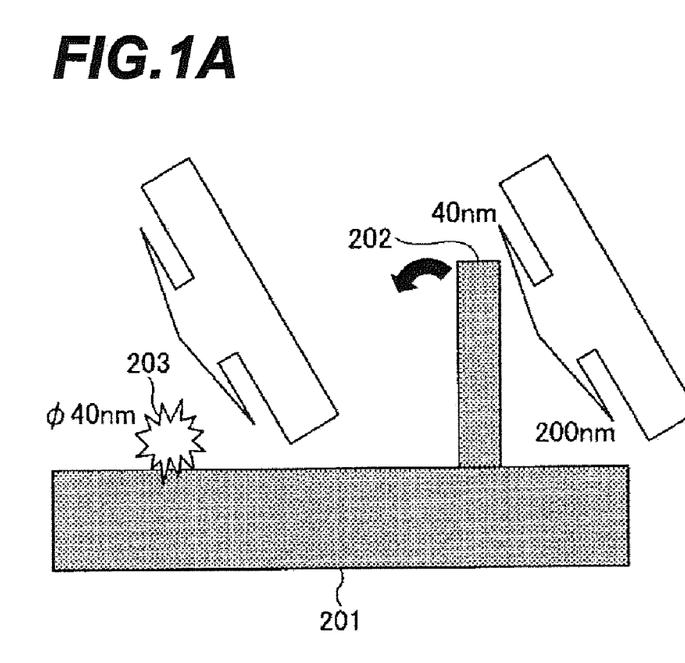
FIGS. 1A and 1B illustrate a substrate cleaning method.

First, a substrate cleaning method according to the present disclosure will be described. As shown in FIG. 1A, when a semiconductor substrate 201 with a pattern 202 is cleaned as described above, the damage, such as the pattern collapse, may be easily incurred. That is, when semiconductor substrate 201 with pattern 202 formed of a resist, a silicon, or a oxide film is cleaned by striking large particles against semiconductor substrate 201 or striking fine particles against semiconductor substrate 201 with strong power at a high speed, particles 203 on a surface of semiconductor substrate 201 are removed, but at the same time, large force is applied to pattern 202, so that pattern 202 may collapse or a shape of pattern 202 may deform.

Figure 1B:
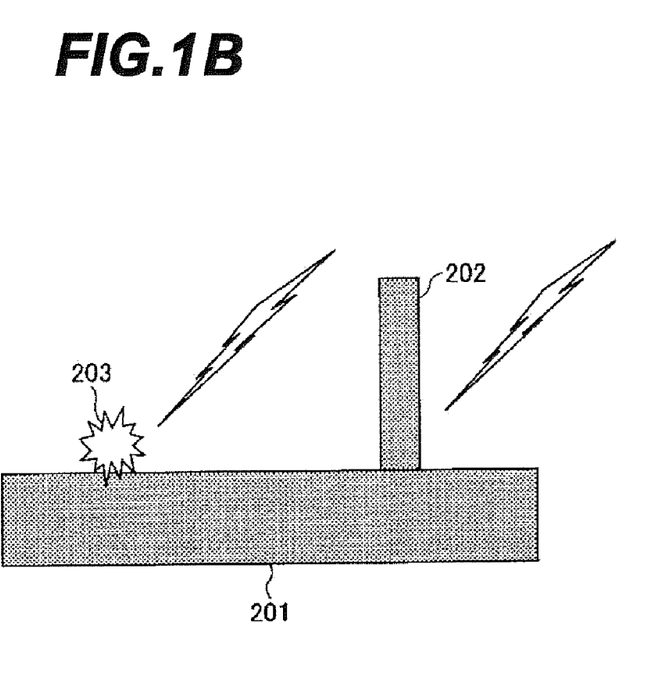

Because of this, as shown in FIG. 1B, the substrate cleaning method and substrate cleaning apparatus according to the present disclosure uses cleaning particulates with a size appropriate for the cleaning, thereby removing only particles 203 without deteriorating pattern 202 formed on semiconductor substrate 201.

(Substrate Cleaning Apparatus)

Figure 2:
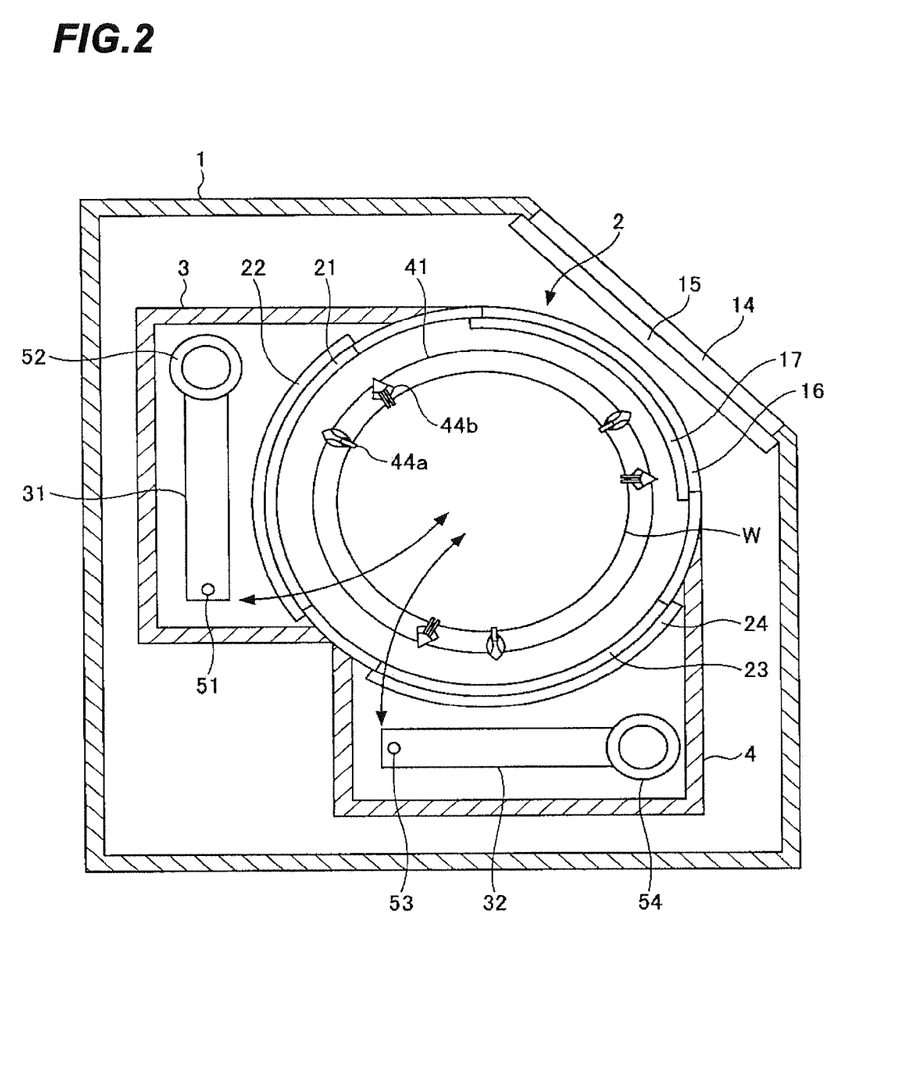
FIG. 2 is a plan view illustrating a substrate cleaning apparatus according to an embodiment.
Figure 3:
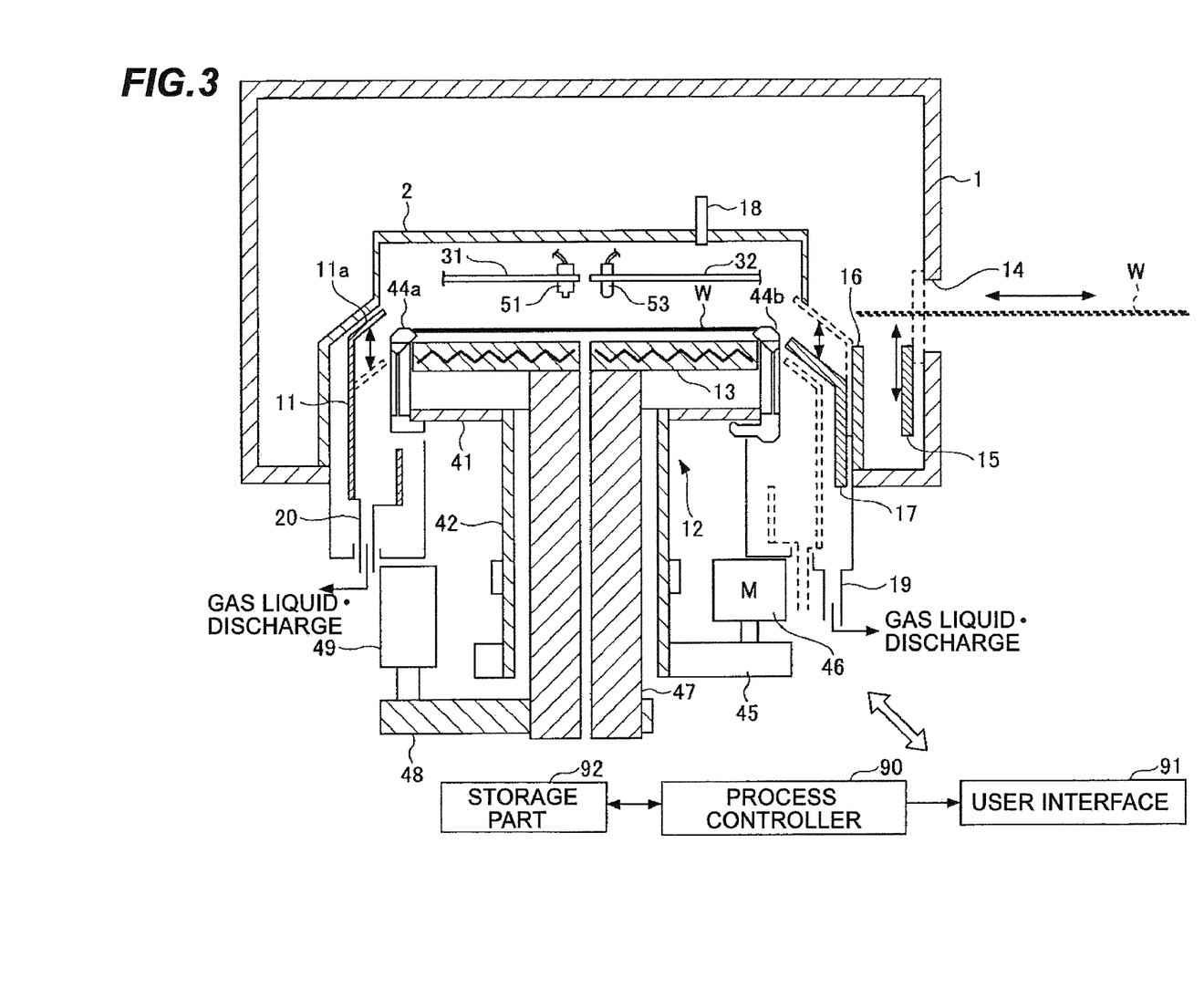
FIG. 3 is a cross-sectional view schematically illustrating the substrate cleaning apparatus according to the embodiment.
Figure 4:
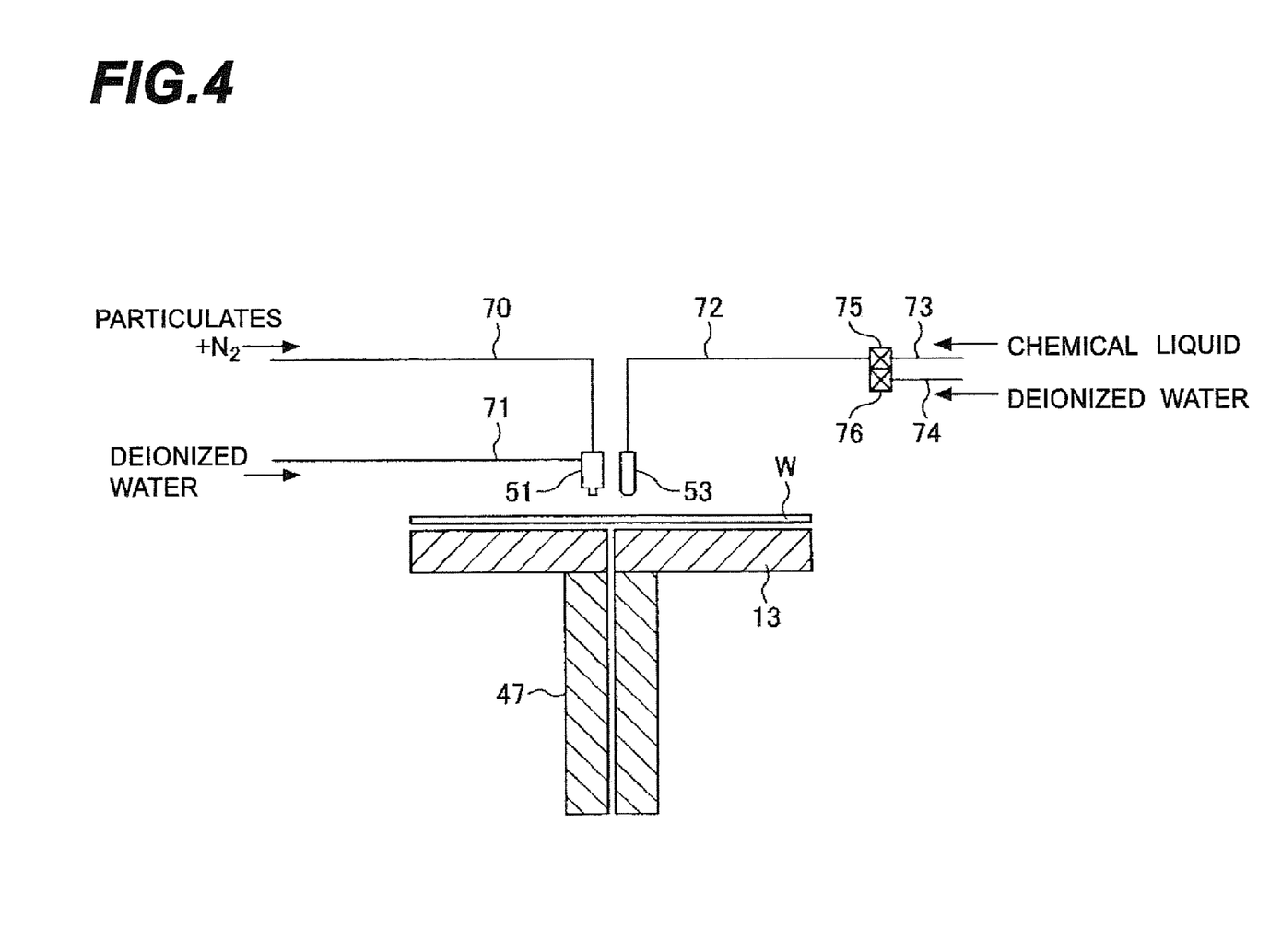
FIG. 4 schematically illustrate the substrate cleaning apparatus according to the embodiment.

Next, a substrate cleaning apparatus 100 according to the present embodiment will be described with reference to FIGS. 2 to 4. FIG. 2 is a plan view of substrate cleaning apparatus 100 according to the present embodiment. FIG. 3 is a cross-sectional view schematically illustrating substrate cleaning apparatus 100 according to the present embodiment, and FIG. 4 is an enlarged view illustrating a part of FIG. 3.

Substrate cleaning apparatus 100 according to the present embodiment includes a housing 1, an external chamber 2 to perform a cleaning process and receive the substrate in an inside of housing 1, a cleaning-nozzle-arm containing part 3 to contain a cleaning nozzle arm 31 for cleaning the nozzle, and a rinsing-liquid-nozzle-arm containing part 4 to contain a rinsing-liquid nozzle arm 32 for supplying a rinsing liquid.

Further, an inside of external chamber 2 includes an internal cup 11, a spin chuck 12 to hold a wafer W, that is the substrate, within internal cup 11, an under plate 13 movable up and down to face wafer W at a rear side of wafer W held by spin chuck 12.

Housing 1 includes a window part 14 to function as a wafer loading/unloading port, and window part 14 is configured to be able to open and close freely by a first shutter 15. Window part 14 is in an open state by first shutter 15 when wafer W is loaded or unloaded, and window part 14 is in a close state except when wafer W is loaded or unloaded. First shutter 15 opens and closes window part 14 of housing 1. In a state where window part 14 is closed by first shutter 15, it is possible to prevent an atmosphere within housing 1 from leaking even if an inside of housing 1 becomes the positive pressure.

A window part 16 functioning as a loading/unloading port of wafer W is provided at a location corresponding to that of window part 14 at a lateral part of external chamber 2. Window part 16 is configured to be able to open and close freely by a second shutter 17. Window part 16 is in an open state by second shutter 17 when wafer W is loaded or unloaded. Window part 16 is in a close state except when wafer W is loaded or unloaded. The cleaning process of wafer W is performed within external chamber 2. When wafer W is loaded or unloaded, both window part 14 and window part 16 are in the open state and a carrying arm (not shown) is inserted from the outside into external chamber 2 to transfer wafer W to spin chuck 12.

Second shutter 17 opens or closes window part 16 of external chamber 2. In a state where second shutter 17 closes window part 16, it is possible to prevent an atmosphere within external chamber 2 from leaking even if an inside of external chamber 2 becomes positive pressure.

A gas supply port 18 is provided on an upper wall of external chamber 2. Gas supply port 18 supplies $N_2$ gas or inert gas into external chamber 2. Gas supply port 18 can create down-flow within external chamber 2 and exclude the cleaning particulate or liquid that is supplied to wafer W held by spin chuck 12. Further, such a creation of down-flow can achieve an effect of constraining the creation of a watermark on a surface of wafer W. A drain part 19 is formed at a bottom of external chamber 2 and the cleaning particulate or liquid excluded by the down-flow is discharged from drain part 19.

Internal cup 11 prevents the cleaning particulate or liquid that is supplied to wafer W from being scattered to surroundings. Internal cup 11 surrounds spin chuck 12 within external chamber 2. An upper part of internal cup 11 is formed with a taper part 11a, and a bottom part of internal cup 11 is connected to a drain part 20. Further, internal cup 11 is configured to be able to freely move up and down between a processing location (indicated by a solid line in FIG. 3) where the upper end of internal cup 11 is higher than wafer W held by spin chuck 12 and taper part 11a encloses wafer W and a retreat location (indicated by a dotted line in FIG. 3) where the upper end of internal cup 11 is lower than wafer W held by spin chuck 12.

Internal cup 11 moves to the retreat location in order not to prohibit the carrying arm (not shown) from going in and out on loading and unloading wafer W. In the meantime, internal cup 11 moves to the processing location when the cleaning process is performed on wafer W held by spin chuck 12.

Spin chuck 12 includes a rotation plate 41 and a rotation cylinder 42. Rotation cylinder 42 is connected to a central part of rotation plate 41 and extends downwardly from rotation plate 41. A support pin 44a to support wafer W and a hold pin 44b to hold wafer W are attached to a periphery of rotation plate 41. By using support pin 44a, wafer W is transferred between the carrying arm (not shown) and spin chuck 12.

Support pins 44a may be installed in at least 3 locations to completely support wafer W. In order for the hold pin 44b not to interfere with the transfer of wafer W between the carrying arm and spin chuck 12, a part located at a lower part of rotation plate 41 is pressed toward rotation plate 41 by a press mechanism (not shown), so that the upper end of hold pin 44b is inclined to move outwardly with respect to rotation plate 41. Hold pins 44b may be also installed in at least 3 locations to hold wafer W completely.

A belt 45 winds a circumferential surface of a lower end of rotation cylinder 42. Belt 45 is driven by a motor 46 so as to rotate rotation cylinder 42 and rotation plate 41 and rotate wafer W held by hold pin 44b.

Under plate 13 is connected to a shaft 47 that extends through a center part of rotation plate 41 and an inside of rotation cylinder 42. A lower part of shaft 47 is fixed to a horizontal board 48. Horizontal board 48 can move up and down integrally with shaft 47 by an elevating mechanism 49, such as an air cylinder. Further, under plate 13 descends to a location adjacent to rotation plate 41 by elevating mechanism 49 in order not to collide with the carrying arm when wafer W is transferred between spin chuck 12 and the carrying arm.

A window part 21 is formed on a part in which cleaning-nozzle-arm containing part 3 is adjacent to external chamber 2. Window part 21 can open and close freely by a third shutter 22. Therefore, by closing third shutter 22, an atmosphere of cleaning-nozzle-arm containing part 3 can be separated from that of external chamber 2. Further, a window part 23 is formed on a part in which rinsing-liquid-nozzle-arm containing part 4 is adjacent to external chamber 2. Window part 23 can open and close freely by a fourth shutter 24. Therefore, by closing fourth shutter 24, an atmosphere of rinsing-liquid-nozzle-arm containing part 4 can be separated from that of external chamber 2.

Cleaning nozzle arm 31 contained in cleaning-nozzle-arm containing part 3 can pivot between cleaning-nozzle-arm containing part 3 and a upper location of a central part of wafer W within external chamber 2 by a driving mechanism 52 installed at a rear end of cleaning nozzle arm 31, and move up and down. A cleaning nozzle 51 is installed at a front end of cleaning nozzle arm 31.

Further, rinsing-liquid nozzle arm 32 contained in rinsing-liquid-nozzle-arm containing part 4 can pivot between rinsing-liquid-nozzle-arm containing part 4 and a upper location of a central part of wafer W within external chamber 2 by a driving mechanism 54 installed at a rear end of rinsing-liquid nozzle arm 32, and move up and down. A rinsing-liquid supply nozzle 53 is installed at a front end of rinsing-liquid nozzle arm 32.

Cleaning nozzle 51 is connected to a particulate gas line 70 and a deionized-water supply line 71. Deionized water sprayed from cleaning nozzle 51 is discharged together with the cleaning particulates and $N_2$ gas.

Rinsing-liquid supply nozzle 53 is connected with a rinsing-liquid supply line 72. Rinsing-liquid supply line 72 is connected to a chemical-liquid supply line 73 and a deionized-water supply line 74 through valves 75 and 76, respectively. Rinsing-liquid supply line 72 supplies the rinsing liquid to the surface of wafer W. Further, if the rinsing liquid supplied to rinsing-liquid supply nozzle 53 is deionized water, deionized water is supplied only from deionized-water supply line 74.

Each constitution of substrate cleaning apparatus 100 according to the present embodiment is connected to and controlled by a process controller 90 including a CPU. Process controller 90 is connected with a user interface 91 and a storage part 92. User interface 91 includes a keyboard with which a process manager input a command to manage each constitution of substrate cleaning apparatus 100, and a display for visualizing and displaying an operating status of each constitution of substrate cleaning apparatus 100. Storage part 92 stores a recipe including a control program or processing condition data to execute various processes performed with a wafer cleaning apparatus under the control of process controller 90.

Further, substrate cleaning apparatus 100 can perform a desired process under the control of process controller 90 by receiving an instruction from user interface 91, reading any recipe from storage part 92, and executing the recipe on process controller 90. The recipe may be stored in a readable storage medium, such as CD-ROM, hard disk, flexible disk, non-volatile memory, and further can be transferred from an appropriate device, such as an exclusive line, to be used on online.

(Cleaning Particulate)

Next, the cleaning particulates and $N_2$ gas supplied from cleaning nozzle 51 will be described in more detail.

The cleaning particulates used for the substrate cleaning according to the present embodiment can remove only the particles without damaging the pattern formed on the substrate. That is, the cleaning particulates with a diameter ranging from 100 nm to 100 μm strikes against the substrate, so that the pattern formed on the substrate is not damaged and the particles are removed.

TABLE 1

| | Particle diameter [μm] | Speed [m/sec] | Density [g/cm$^3$] | Momentum [kg * m/s] | Kinetic energy [kg * m$^2$/S$^2$] |
|---|---|---|---|---|---|
| CaO | 0.1 | 150 | 3.35 | 2.6E−16 | 2.0E−14 |
| | 1 | 150 | 3.35 | 2.6E−13 | 2.0E−11 |
| | 10 | 150 | 3.35 | 2.6E−10 | 2.0E−08 |

Table 1 represents the relationship among a particle diameter, momentum, and kinetic energy of the cleaning particulates including CaO. Referring to Table 1, it can be noted that as the particle diameter of the cleaning particulates increases, the momentum and kinetic energy increases. If the particle diameter is 100 nm or larger, it is possible to obtain the momentum and kinetic energy available for cleaning at least the substrate. Therefore, the particle diameter of the cleaning particulates is preferably 100 nm or larger, more preferably 1 μm or larger. Further, if the particle diameter of the cleaning particulates exceeds 100 μm, the particle becomes larger than the pattern formed on the substrate and the damage on the pattern of the substrate increases in comparison with the effect of removing the particles by cleaning. Therefore, the particle diameter of the cleaning particulates is preferably 100 μm or less.

Further, a material of the cleaning particulates may be a water-soluble material easily dissolved in water, or latex having extremely low adhesive power with respect to the substrate.

Since the water-soluble material easily dissolved in water is easily removed by dissolving in the rinsing liquid later, the water-soluble material can be used for the material of the cleaning particulates. Such a material may include a water-soluble oxide, such as CaO, $Y_2O_3$, or $V_2O_5$.

Further, the cleaning particulate including the latex may be a particulate including polystyrene.

A mechanism for removing the particle by the cleaning particulates will be described below with reference to FIGS. 5A to 5C. It is assumed that substrate 100 to be cleaned rotates.

Figure 5A:
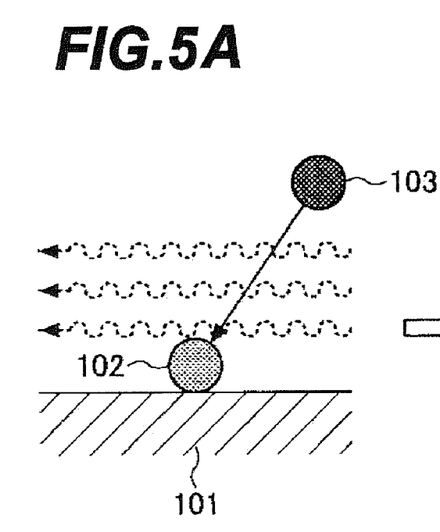
FIGS. 5A to 5C illustrate a substrate cleaning method according to the embodiment.

First, as shown in FIG. 5A, the cleaning particulate 103 collides with a particle 102 existing on substrate 101.

Figure 5B:
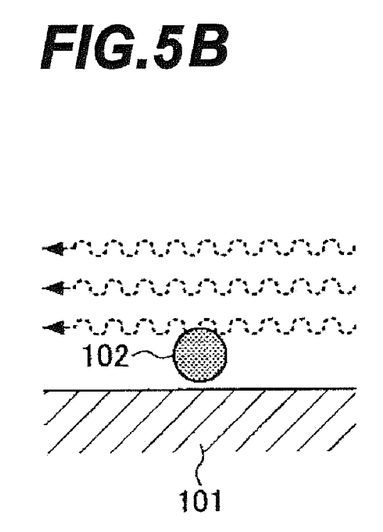

As shown in FIG. 5B, collided particle 102 slightly rises on substrate 101.

Figure 5C:
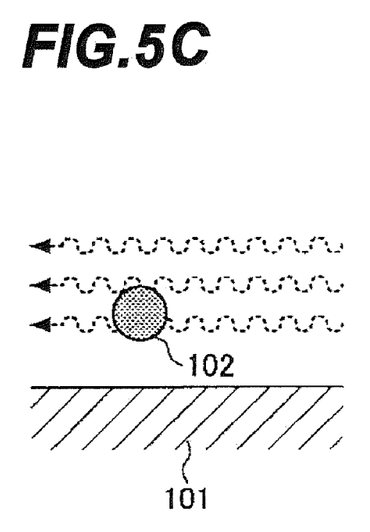

Then, as shown in FIG. 5C, particle 102 is removed from substrate 101 by an air current generated by the rotation of the substrate.

In the present embodiment, deionized water is supplied from deionized-water supply line 71. However, it is possible to electro-statically remove cleaning particulates 103 efficiently by using any liquid of specified pH instead of deionized water. When removing the cleaning particulates on substrate 101, cleaning particulates 103 may be efficiently removed by using the liquid of between neutral and weakened-alkaline, i.e., the liquid of ranging from pH 7 to pH 11.

Figure 6:
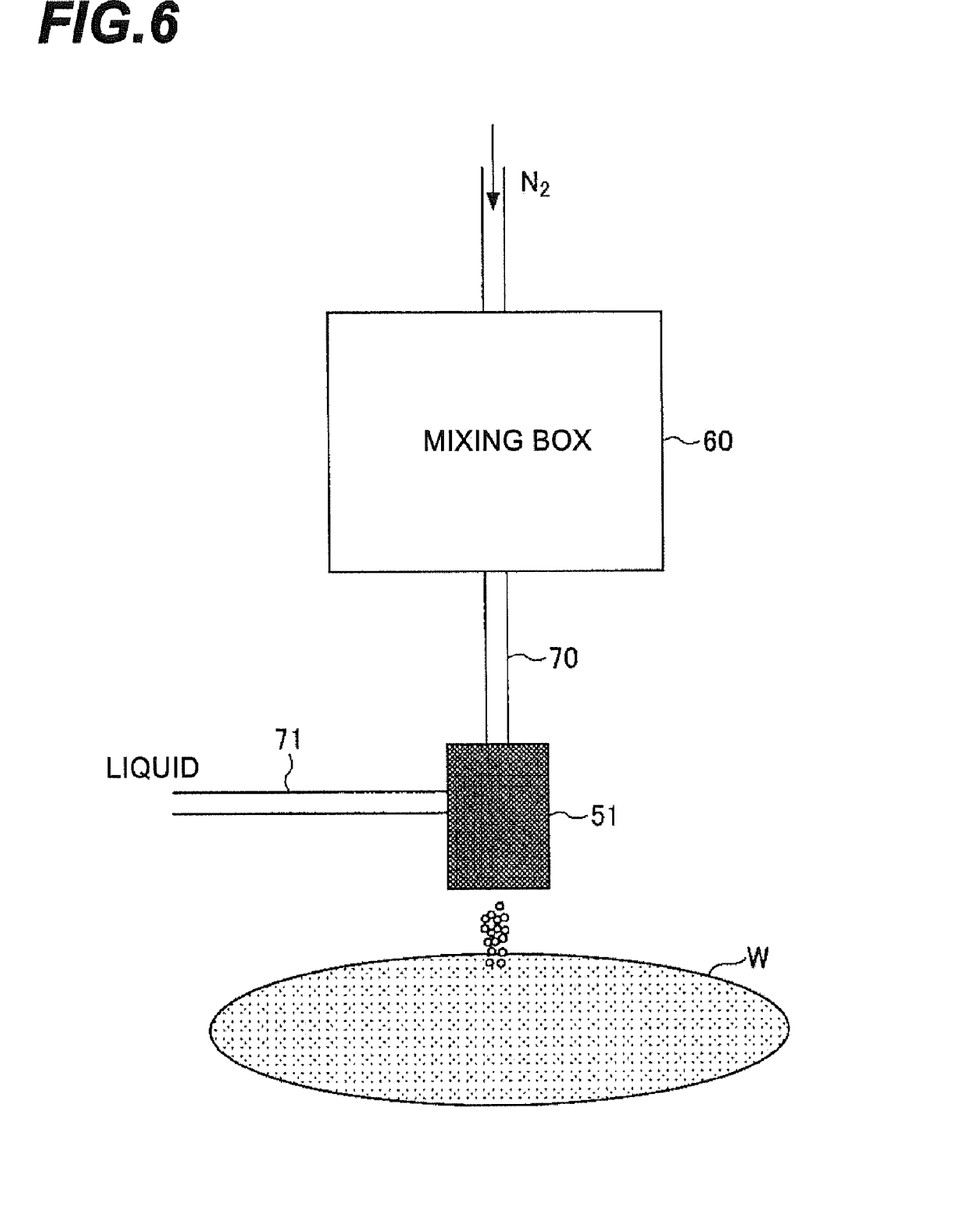
FIG. 6 illustrates the structure of a cleaning nozzle part used in the substrate cleaning apparatus according to the embodiment.

Next, cleaning nozzle 51 will be described. In the present embodiment, the cleaning particulates are mixed with $N_2$ gas to be supplied from cleaning nozzle 51.

As shown in FIG. 6, in substrate cleaning apparatus 100 according to the present embodiment, cleaning nozzle 51 is a two-fluid nozzle and connected to particulate gas line 70 and deionized-water supply line 71. Particulate gas line 70 is connected to a mixing box 60. $N_2$ gas introduced into mixing box 60 is mixed with the cleaning particulates within mixing box 60, and the mixture mixed with deionized water in cleaning nozzle 51 can be supplied toward wafer W.

Figure 7:
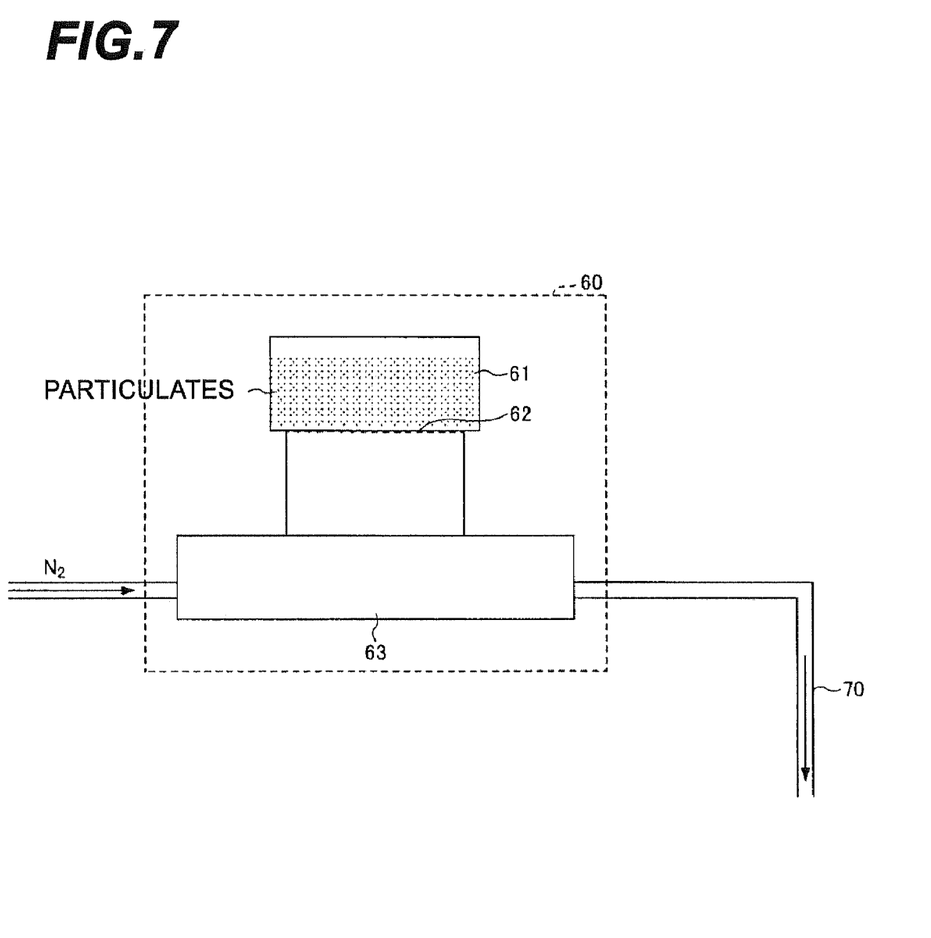
FIG. 7 illustrates a mixing box.

FIG. 7 illustrates an example of mixing box 60. Within mixing box 60, the cleaning particulates are received within a vessel 61. A bottom surface of vessel 61 is formed with a mesh 62 through which the cleaning particulates passes. The cleaning particulates passing the mesh are mixed with $N_2$ gas in a mixing part 63 to which $N_2$ gas is introduced to be supplied to particulate gas line 70.

Figure 8:
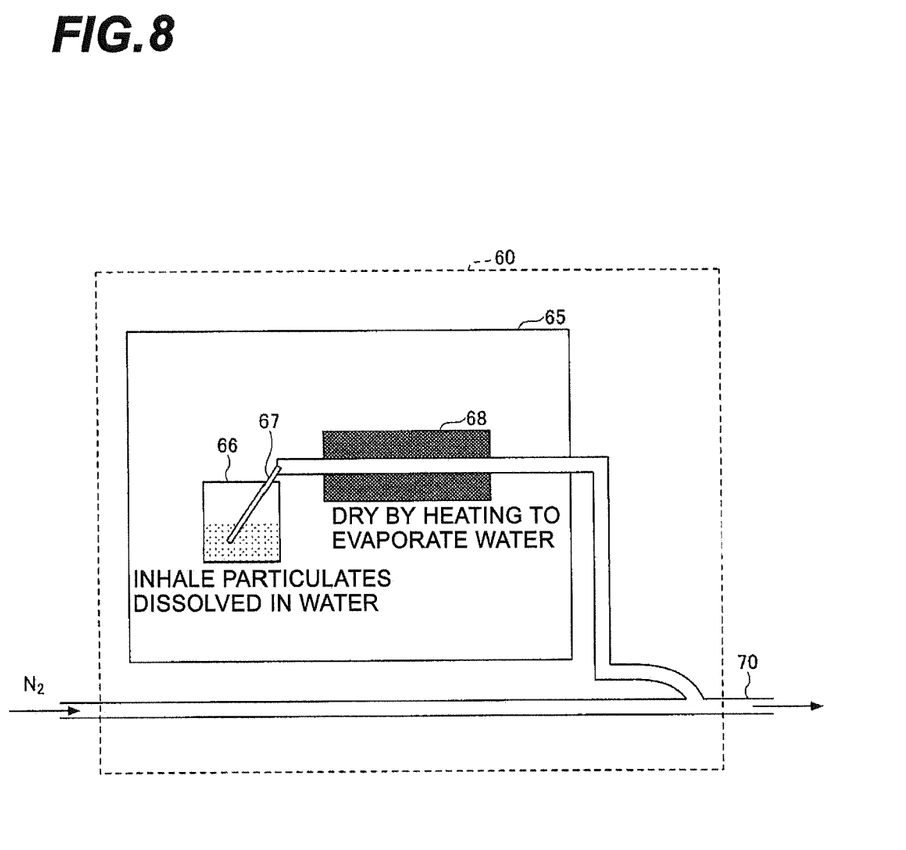
FIG. 8 illustrates another mixing box.

Further, FIG. 8 illustrates another example of mixing box 60. A nebulizer 65 is installed within mixing box 60. Nebulizer 65 supplies the cleaning particulates. Nebulizer 65 includes a vessel 66 having water and the cleaning particulates dissolved therein. The solution of water and the cleaning particulates is supplied to a heating part 68 via a suction tube 67 by supplying $N_2$ gas, or the like, to vessel 66. Water is evaporated in heating part 68, so that only the cleaning particulates are left and the left cleaning particulates are mixed with $N_2$ gas supplied into mixing box 60 to be supplied to particulate gas line 70.

Figure 9:
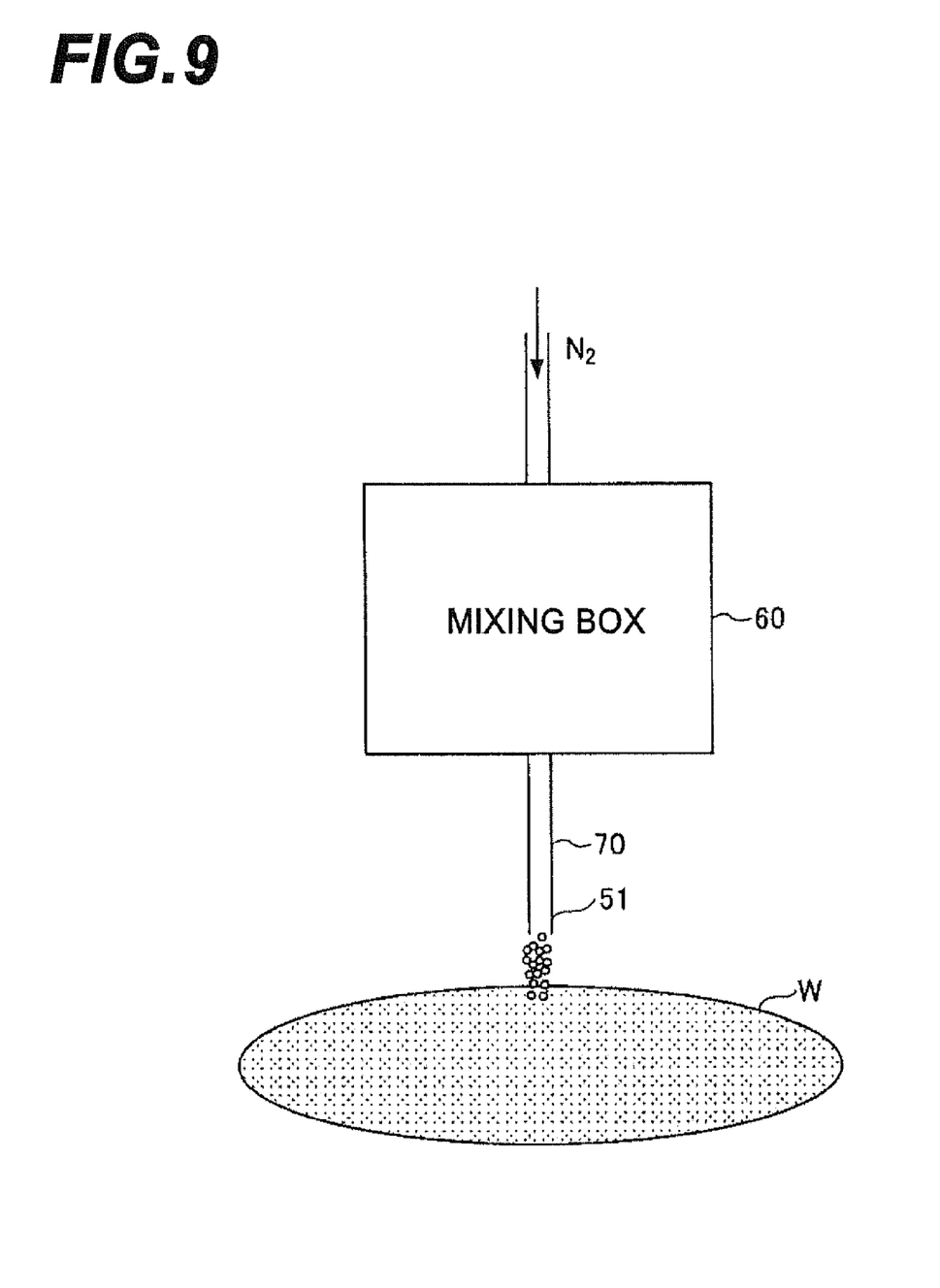
FIG. 9 illustrates the structure of another cleaning nozzle part used in a substrate cleaning apparatus according to the embodiment.

Further, cleaning nozzle 51 of substrate cleaning apparatus 100 according to the present embodiment may include only particulate gas line 70 without being connected to deionized-water supply line 71. In particular, as shown in FIG. 9, the $N_2$ gas line is connected to mixing box 60. $N_2$ gas introduced into mixing box 60 is mixed with the cleaning particulates in mixing box 60, and the cleaning particulates carried in the flow of $N_2$ gas is supplied from cleaning nozzle 51 formed on the front end of particulate gas line 70 to wafer W. In this case, the particles on wafer W are removed by the cleaning particulates carried in the flow of $N_2$ gas supplied from cleaning nozzle 51. Further, the configuration of mixing box 60 is substantially identical to that shown in FIGS. 7 and 8.

Further, the cleaning particulates used for cleaning are supplied in a large quantity, so that the cleaning particulates may be attached to the substrate even after removing the particles. Because of this, in the substrate cleaning apparatus according to the present embodiment, it is possible to clean the substrate with the cleaning particulates and then remove the cleaning particulates with the rinsing liquid. In this case, the pH value of the rinsing liquid may range from 7 to 11 to electro-statically and efficiently remove the cleaning particulates from the surface of the substrate.

Further, if the latex is used as the cleaning particulate, the silicon wafer of the substrate has the negative zeta potential, for example, from −20 to −30 mV. If a material has the negative zeta potential in deionized water, the material is difficult to be attached to the silicon wafer, so that the cleaning particulates can be efficiently removed through rinsing with only deionized water.

Further, the material having the negative zeta potential in deionized water includes $TiO_2$, $Si_3N_4$, $Fe_3O_4$, CuO, FeO, $MnO_2$, Co, $Ni_3P$, Si, $Ni_5P_4$, SiO, $SiO_2$, PS latex, PS, and $\gamma$-$Fe_2O_3$. As the negative zeta potential of the material increase, the material becomes more difficult to be attached to the silicon wafer. Therefore, $MnO_2$, Si, PS latex, and PS having −30 mV or lower negative zeta potential may be used.

[Substrate Cleaning Method]

Figure 10:
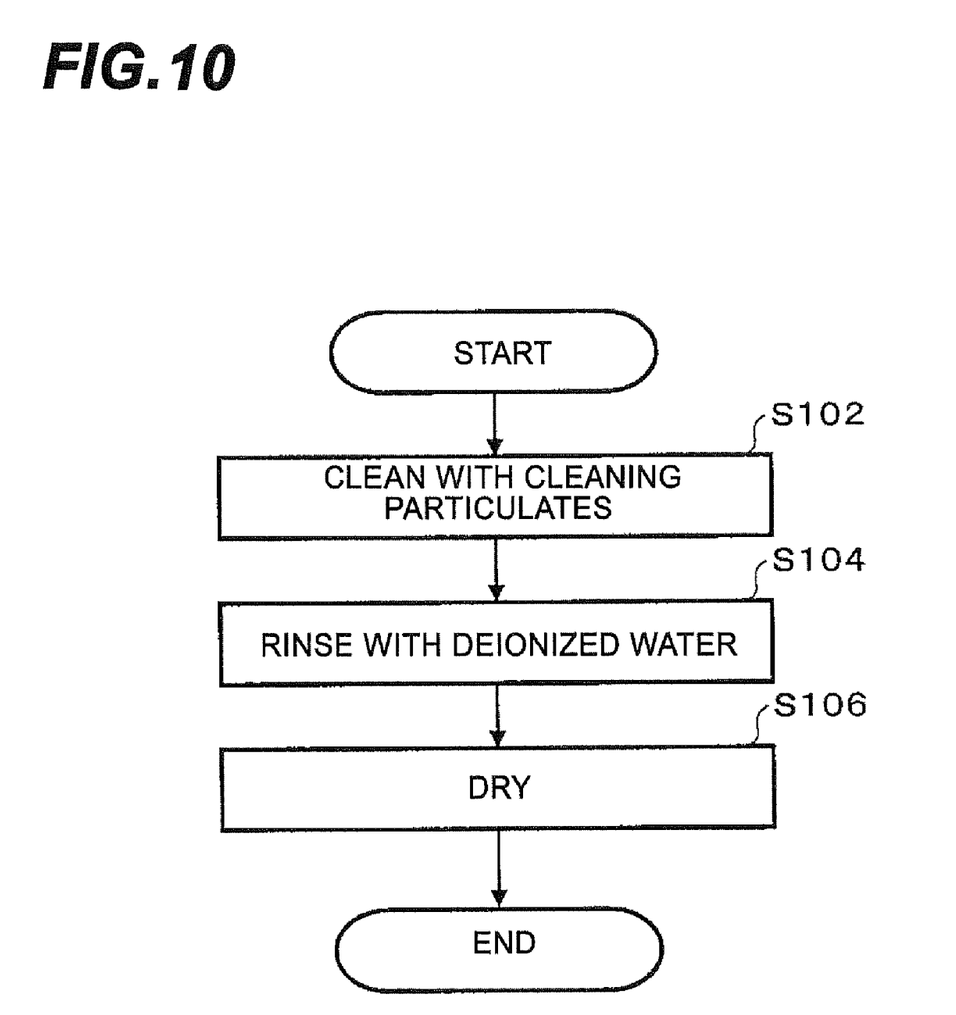
FIG. 10 is a flowchart illustrating a cleaning method according to an embodiment of the present disclosure.
Figure 11A:
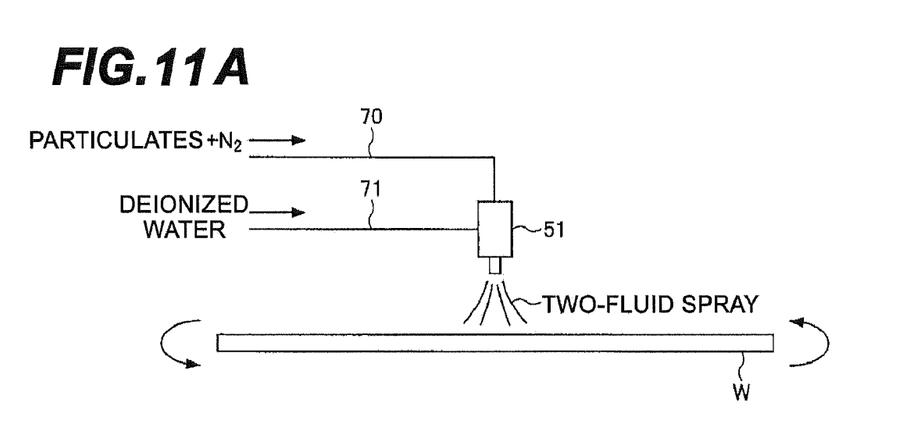
FIGS. 11A to 11C are the processing views illustrating a cleaning method according to an embodiment of the present disclosure.
Figure 11B:
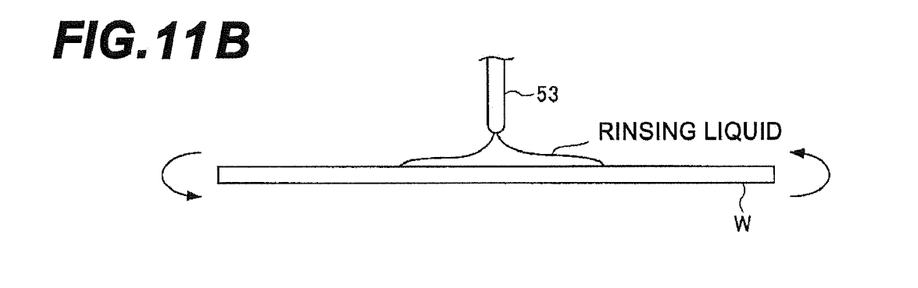
Figure 11C:
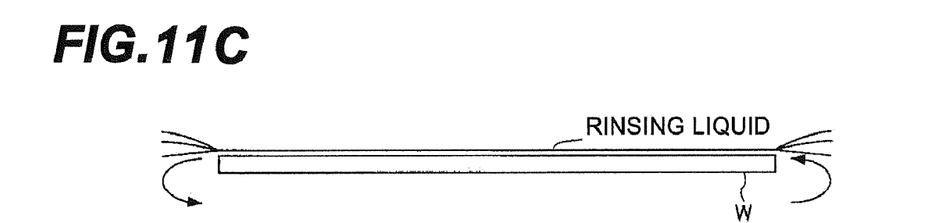

Next, the substrate cleaning method according to the present embodiment will be described. FIG. 10 is a flowchart illustrating the substrate cleaning method according to the present embodiment, and FIGS. 11A to 11C are the processing views illustrating the substrate cleaning method according to the present embodiment.

First, the cleaning process is performed with the cleaning particulates in step S102. In particular, as shown in FIG. 11A, while wafer W is rotated, a two-fluid spray containing the cleaning particulates is supplied to wafer W from cleaning nozzle 51 of substrate cleaning apparatus 100 and the particles attached to the surface of wafer W are removed.

Next, the rinsing process is performed with deionized water in step S104. In particular, as shown in FIG. 11B, while wafer W is rotated, the rinsing liquid is supplied from rinsing-liquid supply nozzle 53 and the cleaning particulates remained on the surface of wafer W are removed.

Next, the drying process is performed in step S106. In particular, as shown in FIG. 11C, wafer W is rotated at a high speed and the rinsing liquid is removed by the centrifugal force to dry wafer W.

As such, the processes according to the present embodiment are performed.

Further, in step S102, the case where cleaning nozzle 51 is the two-fluid nozzle was described. However, even if using cleaning nozzle 51 configured as shown in FIG. 9, it is possible to perform the cleaning process in the same method as above.

Further, in the description of the present embodiment, the rising process is performed in step 104. However, the cleaning particulates may be removed through supplying only nitrogen gas for a specified time. In this case, the drying process of step S106 may be not necessary.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate cleaning method for cleaning particles on a substrate, comprising the steps of:

mixing cleaning particulates made of a solid material only with dry air or inert gas;

flowing the cleaning particulates mixed only with dry air or inert gas toward a surface of the substrate so that the cleaning particulates strike the particles on the substrate and the particles rise from the surface of the substrate;

removing the particles from the substrate by an air current generated by rotating the substrate; and removing the cleaning particulates from the substrate,
wherein the mixing is performed using a mixing box in which a mesh is used to filter the cleaning particulates before the cleaning particulates are mixed only with the dry air or inert gas.

2. The substrate cleaning method of claim 1, wherein each of the cleaning particulates has a particle diameter ranging from 100 nm to 100 μm.

3. The substrate cleaning method of claim 1, wherein the substrate is rotated during the flowing step.

4. The substrate cleaning method of claim 1, wherein removing the cleaning particulates comprises supplying a rinsing liquid to the substrate.

5. The substrate cleaning method of claim 1, wherein removing the cleaning particulates comprises supplying inert gas to the substrate.

6. The substrate cleaning method of claim 1, wherein the cleaning particulates are made of a water-soluble oxide.

7. The substrate cleaning method of claim 1, wherein the cleaning particulates are made of latex.

8. The substrate cleaning method of claim 1, wherein a pattern is formed on the substrate.

9. A computer-readable storage medium storing a control program executed on a computer, the control program allowing the computer to control a substrate cleaning apparatus to perform the substrate cleaning method of claim 1.

10. The substrate cleaning method of claim 1, wherein the mixing box includes a vessel having water and the cleaning particulates dissolved therein, and the dissolved cleaning particulates are subsequently separated from the water by a heater to be mixed with the dry air or inert gas.

11. The substrate cleaning method of claim 4, wherein the rinsing liquid has a pH between 7 and 11.

12. The substrate cleaning method of claim 4, further comprising drying the substrate by rotating the substrate to remove the rinsing liquid from the surface of the substrate after the supply of the rinsing liquid.

13. The substrate cleaning method of claim 4, wherein the cleaning particulates are made of a material having a negative zeta potential in the rinsing liquid.

14. The substrate cleaning method of claim 6, wherein the oxide comprises CaO or $Y_2O_3$.

* * * * *